(12) United States Patent
Kim et al.

(10) Patent No.: US 11,849,613 B2
(45) Date of Patent: *Dec. 19, 2023

(54) DISPLAY MODULE COMPRISING SIDE WIRINGS AND LARGE FORMAT DISPLAY APPARATUS USING THE SAME

(71) Applicant: SAMSUNG ELECTRONICS CO., LTD., Suwon-si (KR)

(72) Inventors: Eunhye Kim, Suwon-si (KR); Doyoung Kwag, Suwon-si (KR); Sangmoo Park, Suwon-si (KR); Minsub Oh, Suwon-si (KR); Yoonsuk Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 25 days.

This patent is subject to a terminal disclaimer.

(21) Appl. No.: 17/523,281

(22) Filed: Nov. 10, 2021

(65) Prior Publication Data

US 2022/0069061 A1 Mar. 3, 2022

Related U.S. Application Data

(63) Continuation of application No. 16/681,290, filed on Nov. 12, 2019, now Pat. No. 11,201,202.

(30) Foreign Application Priority Data

Nov. 16, 2018 (KR) .................. 10-2018-0141236

(51) Int. Cl.
*H10K 59/131* (2023.01)
*H10K 59/121* (2023.01)

(52) U.S. Cl.
CPC ....... *H10K 59/131* (2023.02); *H10K 59/1213* (2023.02)

(58) Field of Classification Search
None
See application file for complete search history.

(56) References Cited

U.S. PATENT DOCUMENTS 9,373,274 B2 6/2016 Okuyama
9,529,217 B1 12/2016 Kim
(Continued)

FOREIGN PATENT DOCUMENTS

EP 3 422 827 A1 1/2019
JP 5685923 B2 3/2015
(Continued)

OTHER PUBLICATIONS

International Search Report (PCT/ISA/210) dated Feb. 20, 2020 issued by the International Searching Authority in International Application No. PCT/KR2019/015306.
(Continued)

*Primary Examiner* — Daniel Whalen
(74) *Attorney, Agent, or Firm* — Sughrue Mion, PLLC

(57) ABSTRACT

A display module includes a substrate; light emitting diodes, first connection pads, second connection pads, and side wirings. The light emitting diodes are arranged on one surface of the substrate. The first connection pads are formed on the one surface of the substrate. The second connection pads are formed on an opposite surface of the one surface. The side wirings are formed on each of a first edge of the substrate and a second edge of the substrate that is adjacent to the first edge. The side wirings electrically couple the first connection pads on the one surface of the substrate with respective ones of the second connection pads on the opposite surface.

9 Claims, 11 Drawing Sheets

(56) References Cited

U.S. PATENT DOCUMENTS

| | | |
|---|---|---|
| 9,709,838 B2 | 7/2017 | Jung et al. |
| 10,468,396 B2 | 11/2019 | Kim et al. |
| 10,935,828 B2 | 3/2021 | Jeong et al. |
| 11,201,202 B2 * | 12/2021 | Kim .................. G09G 3/32 |
| 11,487,143 B2 | 11/2022 | Jeong et al. |
| 2008/0117161 A1 | 5/2008 | Hu |
| 2014/0092338 A1 | 4/2014 | Miyazaki et al. |
| 2015/0282293 A1 | 10/2015 | Lim et al. |
| 2016/0363800 A1 | 12/2016 | Kim |
| 2017/0031643 A1 | 2/2017 | Jeong |
| 2017/0148374 A1 * | 5/2017 | Lee .................. G09G 5/14 |
| 2018/0188579 A1 | 7/2018 | Jeong et al. |
| 2018/0190631 A1 | 7/2018 | Kim et al. |
| 2019/0006335 A1 * | 1/2019 | Lee .................. H01L 23/4985 |
| 2020/0013803 A1 * | 1/2020 | Jang .................. H10K 85/113 |
| 2021/0149235 A1 | 5/2021 | Jeong et al. |
| 2023/0016880 A1 | 1/2023 | Jeong et al. |

FOREIGN PATENT DOCUMENTS

| | | |
|---|---|---|
| KR | 10-2015-0111808 A | 10/2015 |
| KR | 10-2016-0145230 A | 12/2016 |
| KR | 10-2016-0147173 A | 12/2016 |
| KR | 10-2017-0015773 A | 2/2017 |
| KR | 10-2017-0059523 A | 5/2017 |
| KR | 10-1796813 B1 | 11/2017 |
| KR | 10-2017-0135468 A | 12/2017 |
| KR | 10-2018-0079079 A | 7/2018 |
| KR | 10-2018-0079080 A | 7/2018 |
| WO | 2014/119972 A1 | 8/2014 |

OTHER PUBLICATIONS

Written Opinion (PCT/ISA/237) dated Feb. 20, 2020 issued by the International Searching Authority in International Application No. PCT/KR2019/015306.

Communication dated Oct. 1, 2021 issued by the European Intellectual Property Office in counterpart European Application No. 19883789.0.

Communication dated Jan. 11, 2023 by the Korean Intellectual Property Office in counterpart Korean Patent Application No. 10-2018-0141236.

Communication dated Jul. 7, 2023 by the Korean Intellectual Property Office in counterpart Korean Patent Application No. 10-2018-0141236.

* cited by examiner

DISPLAY MODULE COMPRISING SIDE WIRINGS AND LARGE FORMAT DISPLAY APPARATUS USING THE SAME

CROSS-REFERENCE TO RELATED APPLICATION(S)

This application is a continuation application of U.S. application Ser. No. 16/681,290, filed on Nov. 12, 2019, which is based on and claims priority under 35 U.S.C. § 119(a) of a Korean patent application number 10-2018-0141236, filed on Nov. 16, 2018, in the Korean Intellectual Property Office, the disclosures of each of which are incorporated by reference herein in their entireties.

BACKGROUND

1. Field

The disclosure relates to a display module and a large format display apparatus using the same, and more particularly, to a display module mounted with a light emitting diode and formed with side wiring for a bezelless implementation and to a large format display apparatus implementing seamlessness by coupling a plurality of the display modules.

2. Description of Related Art

A display apparatus is operated by pixel or sub-pixel units to express various colors. The operation is controlled by a thin film transistor (TFT) of each pixel or sub-pixel. A plurality of TFTs are arranged on a flexible substrate, a glass substrate or a plastic substrate, which is referred to as a TFT substrate.

The TFT substrate such as the above is used as a substrate that drives displays of various sizes, from a flexible device and a small wearable device (for example, a wearable watch, etc.) to a large format TV of tens of inches. In order to drive the TFT substrate, an external integrated circuit (External IC) or driver integrated circuit (Driver IC) capable of applying current to the TFT substrate may be coupled thereto.

Recently, TFT substrates without a bum-in phenomenon for not using organic materials unlike an organic light emitting diode (OLED), with long lifespan, and mounted with light emitting diode using non-organic materials are being produced. TFT substrates mounted with light emitting diode such as the above may be coupled to each circuit through chip on glass (COG) bonding, film on glass (FOG) bonding, or the like. For couplings such as the above, an area, that is, a bezel area, having a fixed surface at the edge of the TFT substrate must be secured.

Currently, research and development on bezelless technology, which reduces or eliminates the bezel area to maximize an active area (AA) displaying a video image on a display module applied with light emitting diode is steadily in progress. Some small display apparatuses such as a smart phone or large format display apparatuses such as a TV or an electronic display board are currently applied with a plurality of bezelless display modules.

SUMMARY

In accordance with an aspect of the disclosure, there is provided a display module comprising a thin film transistor substrate; a plurality of light emitting diodes arranged on one surface of the thin film transistor substrate; and a plurality of side wirings formed on each of a first edge of the thin film transistor substrate and a second edge of the thin film transistor substrate that is adjacent to the first edge to electrically couple components on the one surface of the thin film transistor substrate with components on an opposite surface of the one surface respectively.

In accordance with another aspect of the disclosure, there is provided a large format display apparatus comprising a plurality of the display modules connected to each other, wherein the first edge and the second edge of each of the display modules are arranged on outside edges of the large format display apparatus.

In accordance with another aspect of the disclosure, there is provided a large format display apparatus, wherein a plurality of display modules are consecutively connected, each of the plurality of display modules comprising a thin film transistor substrate; a plurality of light emitting diodes arranged on one surface of the thin film transistor substrate; and a plurality of side wirings formed only on each of one edge of the thin film transistor substrate and another edge adjacent to the one edge, to electrically couple components on the one surface of the thin film transistor substrate with components on an opposite surface to the one surface, respectively.

Additional aspects will be set forth in part in the description which follows and, in part, will be apparent from the description, or may be learned by practice of the presented embodiments.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

Figure 1:
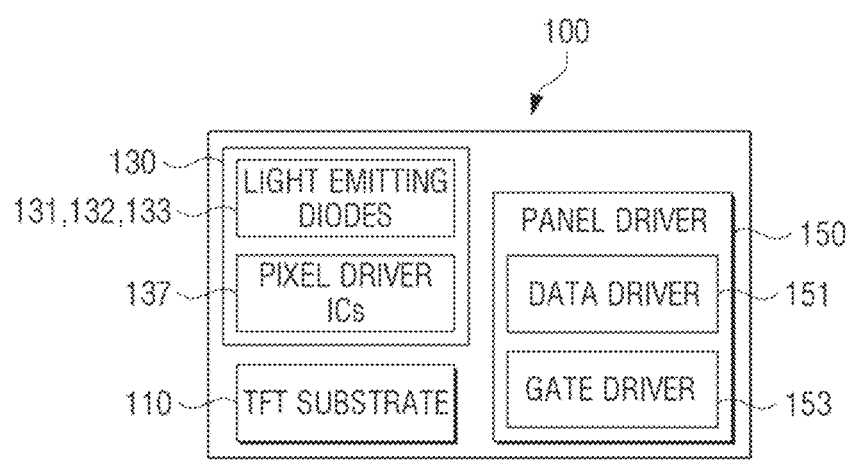
FIG. 1 is a block diagram provided to show a display module according to an embodiment.

In describing the present disclosure, based on determining that the detailed description of related known technologies may unnecessarily confuse the gist of the disclosure, the detailed description thereof will be omitted. Further, it should be noted that repetitive descriptions of the same configuration will be omitted for conciseness.

The suffix "unit" appended to elements used in the description below is only added or used interchangeably for convenience sake in preparing the specification, and does not have a differentiating meaning or function by its own.

The terms used in the present disclosure are used to describe various embodiments, and are not intended to constrain and/or limit the present disclosure. A singular expression includes a plural expression, unless otherwise specified.

It is to be understood that the terms such as 'comprise' or 'have' are used herein to designate a presence of a characteristic, number, step, operation, element, component, or a combination thereof disclosed in the specification, and not to preclude a presence or a possibility of adding one or more of other characteristics, numbers, steps, operations, elements, components or a combination thereof.

Expressions and terms such as "first" or "second" may use corresponding components regardless of importance or order and are used to distinguish one component from another without limiting the components.

Based on a certain element (for example, first element) being indicated as being "(operatively or communicatively) coupled with/to" another element (for example, second element) or "connected to", it is to be understood that a certain element may be directly coupled to another element or may be coupled through an other element (for example, third element). On the other hand, if a certain element (for example, first element) is referred to as being "directly coupled with/to" or "directly connected to" another element (for example, second element), it is to be understood as there is no other element (for example, third element) between the certain element and the another element.

An aspect of the present disclosure is to provide a large format display capable of implementing seamlessness by arranging a display module formed with side wiring for a bezelless implementation and an edge of each display module not formed with side wiring to contact with edges of other display modules that are not formed with side wiring.

In addition, another aspect of the present disclosure is to provide a large format display apparatus capable of implementing seamlessness by maintaining a pitch between the outermost side pixels of the display modules adjacent to each other to be the same as a pitch of a single display module.

To achieve the above aspects, a display module according to an embodiment may include a thin film transistor substrate; a plurality of light emitting diodes arranged on one surface of the thin film transistor substrate; and a side wiring formed in plurality to each of a first edge of the thin film transistor substrate and a second edge adjacent to the first edge to electrically couple the one surface of the thin film transistor substrate with an opposite surface of the one surface respectively.

Each of the plurality of side wirings may be configured to be formed to connect one surface, a side end surface and an other surface of thin film transistor substrate, in which one end is configured to be electrically coupled with a first connection pad disposed on the one surface of the thin film transistor substrate, and an other end is configured to be electrically coupled with a second connection pad disposed on the other surface of the thin film transistor substrate or an electronic element.

In addition, in terms of a large format display apparatus in which a plurality of display modules are consecutively connected, each of the plurality of display modules may comprise a thin film transistor substrate; a plurality of light emitting diodes arranged on a one surface of the thin film transistor substrate; and a side wiring formed in plurality to each of a one edge of the thin film transistor substrate and to an other edge adjacent to the one edge to electrically couple the one surface of the thin film transistor substrate with an opposite surface of the one surface respectively, and since each of the plurality of display modules providing a large format display apparatus arranged such that edges with side wiring are disposed toward an outer part, the objects above may be achieved.

The plurality of display modules may be comprised of first display module to a fourth display module, and each display module in contact with the other may be configured in a 2×2 arrangement such that an edge without side wiring is in contact with each other.

The plurality of display modules may be configured such that the first display module is formed with a side wiring to each of a left side of the edge and a top side of the edge, the second display module is formed with a side wiring to each of a right edge and a top side of the edge, the third display module is formed with a side wiring to each of a left side of the edge and a bottom side of the edge, and the fourth display module is formed with a side wiring to each of a right side of the edge and a bottom side of the edge.

The plurality of light emitting diodes formed on each of the display modules may form one pixel per three diodes, and the pixel may be arranged in plural at a first pitch where a top side, a bottom side, a left side, and a right side are identical on the thin film transistor substrate in a lattice shape.

The large format display apparatus according to an embodiment may further include at least one additional display module formed with a plurality of side wirings to each of two edges adjacent to each other, the additional display module may be configured such that an edge without side wiring is in contact with an edge with side wiring from one of the first display module to the fourth display module, and the pixels disposed closest between each display module from the pixels disposed respectively on any one from the additional display module and the first display module to the fourth display module may be spaced apart at a second pitch that is the same as the first pitch.

As described above, according to various embodiments, based on the edges without side wiring being arranged to be in contact when coupling a plurality of bezelless display modules, a seam is not visible at a portion where each display module is coupled and a display quality of the display apparatus may be improved.

In addition, according to the various embodiments, the display module coupled to an outside of the four display modules coupled to a center may be arranged such that pixel intervals are adjusted with an adjacent display module to implement seamlessness.

A display module according to various embodiments includes side wiring at an edge of a thin film transistor (TFT) substrate to electrically couple a plurality of light emitting elements arranged on a front surface of the TFT substrate with circuits disposed on a back surface of the TFT substrate.

The TFT substrate may be comprised of one of a glass substrate, a flexible substrate and a plastic substrate, and a plurality of TFTs formed on one surface of the respective substrate, and may be referred to as a backplane.

An edge of the TFT substrate may be the outermost side of the TFT substrate. Further, the edge of the TFT substrate may be a dummy area (DA) reaching from outermost side of the TFT substrate to an active area where video images are displayed. Accordingly, the dummy area may include a side end surface of the TFT substrate, a portion of a front surface of a TFT substrate adjacent to the side end surface and a portion of a back surface.

The substrate of the display module according to various embodiments may include a rear substrate which may be electrically coupled to the back surface of the TFT substrate through a flexible printed circuit (FPC).

The rear substrate may be comprised in a thin film form with a thickness of tens of micrometers (for example, 50 gm or less) or in a thin glass form. In the case the rear substrate is comprised of a thin film form, the rear substrate may be formed in from a plastic material such as a polyimide (PI), a polyethylene terephthalate (PET), a polythersulfone (PES), a polyethylene naphtalate (PEN) or a polycabonate (PC).

A light emitting element applied to a display substrate according to an embodiment may be a light emitting diode, and in this case, each light emitting diode may be comprised of a red color sub-pixel (R sub-pixel), a green color sub-pixel (G sub-pixel), and a blue color sub-pixel (B sub-pixel). A single pixel may be comprised of three R, G and B sub-pixels, and each TFT of the TFT substrate may be formed in a sub-pixel unit.

The light emitting diode self illuminates, thereby a backlight unit, a liquid crystal layer and a polarizer may be omitted, and a thin glass layer may be disposed on a top uppermost layer. Accordingly, the light emitting diode of the present disclosure may be formed in a thickness thinner than an OLED. Further, since the light emitting diode uses non-organic materials, no burn-in phenomenon occurs, light emitting efficiency is approximately three folds higher than an OLED using an organic material, and power consumption is halved. Accordingly, if a display module mounted with the light emitting diode of the present disclosure is applied to a smartphone, the screen would be more clearly visible even in bright places and battery use time would increase. Further, the light emitting diode may be mounted on a substrate with a curvature through a roller transfer method and an element may be attached on a substrate capable of stretching like a rubber, making it possible to produce a transparent display that freely changes form. Accordingly, there are no limitations to the actual mountable substrate. Further, the light emitting diode may be produced in size from a micro size to a size of about 100 gm or less, more preferably, about 30 gm or less, and may be implemented in ultra-high resolution based on being applied to a TV of various sizes or to a small wearable device (smart watches, etc.). As described above, the light emitting diode of the present disclosure which is capable of implementing an ultra-high resolution may maximize video image quality based on being applied to a virtual reality (VR) and augmented reality (AR) headset since the change time (time for completely changing color) is on the order of nanoseconds.

The side wiring formed on the edge of the TFT substrate in various embodiments may electrically couple a first connection pad formed on a front surface of the TFT substrate with a second connection pad formed on a back surface of the TFT substrate. For this purpose, the side wiring is formed along a front surface, a side end surface and a back surface of the TFT substrate. One end of the side wiring is electrically coupled to the first connection pad, and another end may be electrically coupled to the second connection pad. At this time, a portion of the side wiring may be formed on the side end surface of the TFT substrate, and thus the side wiring may protrude further than the side end surface of the TFT substrate as much as the thickness of the side wiring. In this case, a rear substrate may be electrically coupled to the second connection pad through a flexible printed circuit (FPC). A driver integrated circuit (driver IC) mounted on the back surface of the TFT substrate may be directly connected to the second connection pad or may be indirectly connected through a separate wiring.

According to various embodiments of the present disclosure, a large format display apparatus may be produced by arranging a plurality of the display modules into a tiled type. The side wiring may be formed on each display module so as to not be disposed between the display modules adjacent to each other to implement seamlessness. In this case, the side wiring formed on one display module may be formed in plurality at intervals along one side of the display module, and may be formed in plurality at regular intervals along a different side adjacent to the one side. Accordingly, side wiring may be formed on the two sides adjacent to each other of the display module.

The various embodiments of the present disclosure may arrange the plurality of display modules and may provide a large format display (LFD) apparatus. In this case, the large format display apparatus is disposed so that the side wiring is not positioned between each display module arranged to be adjacent to each other, to thus implement seamlessness. The side wiring formed on each display module according to the disposition of the display modules is positioned along the outer part of the large format display apparatus. In this case, the display module may be comprised of, for example, four display modules.

The various embodiments of the present disclosure may implement a bigger screen than a large format display apparatus formed with four display modules implementing seamlessness. To this end, a plurality of display modules may be arranged to surround all of the outer part of the four display modules, arranged on the left side and right side of the four display modules, or arranged on a top side and a bottom side of the four display modules.

In the display modules according to the various embodiments of the present disclosure, bezeless implementation may be possible by minimizing a dummy area and maximizing an active area . Under the structure for a bezeless implementation as above, the dummy area may be reduced and thereby the active area may be relatively increased. Accordingly, a mounting density of the light emitting diodes for unit display modules may be increased. Based on coupling a plurality of bezeless implemented display modules in a tiled form, a large format display (LFD) apparatus may be provided capable of maximizing the active area or implementing the total area of the front surface as a pixel emission region.

In this case, each display module, by minimizing the dummy area in the front surface, may maintain a pitch between each pixel of the display modules adjacent to each other to be the same as a pitch between each pixel in a single display module, and thus may implement seamlessness at the coupling portion between the display modules.

The various embodiments of the present disclosure will be described in detail below with references to the accompanying drawings.

Figure 2:
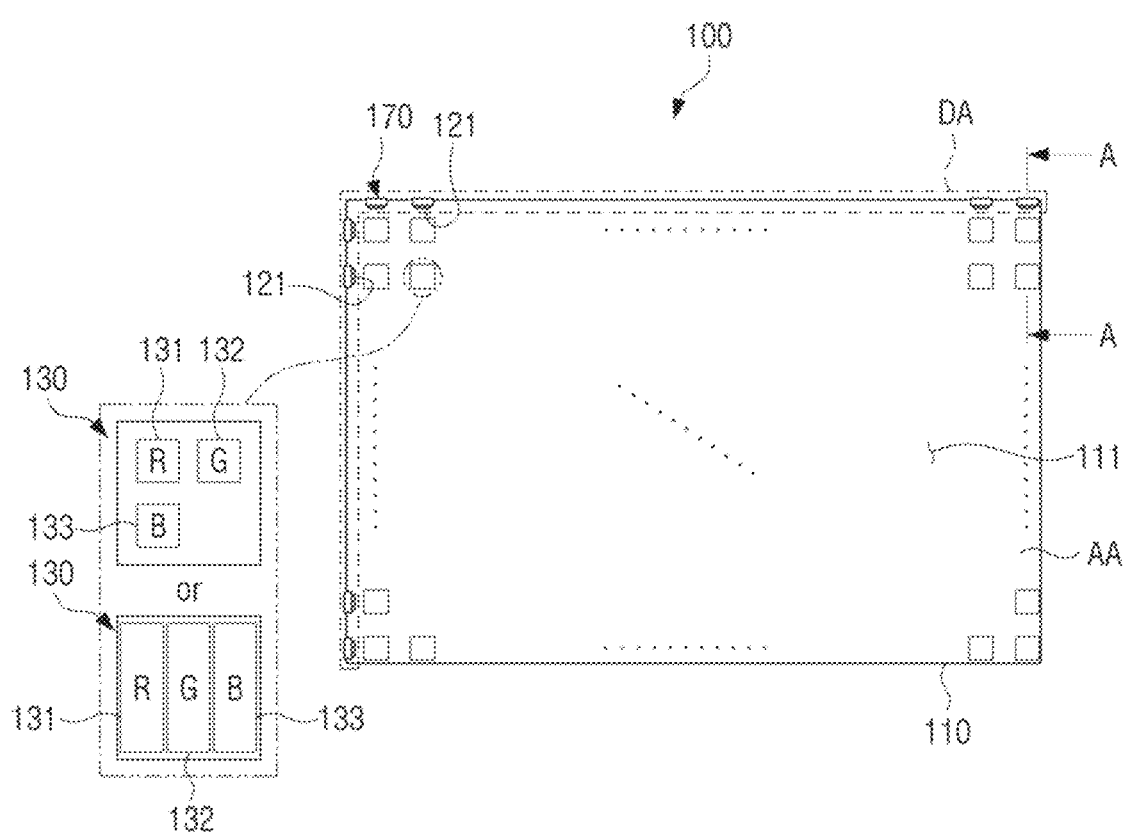
FIG. 2 is front diagram provided to show a display module according to an embodiment.
Figure 3:
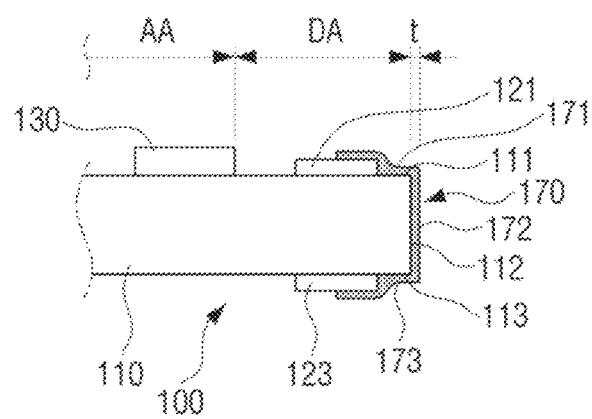
FIG. 3 is a cross-sectional diagram taken along line A-A as indicated in FIG. 2, according to an embodiment.

FIG. 1 is a block diagram provided to show a display module according to an embodiment, FIG. 2 is front diagram provided to show a display module according to an embodiment, and FIG. 3 is a cross-sectional diagram taken along line A-A as indicated in FIG. 2, according to an embodiment.

Referring to FIGS. 1 and 2, a display module 100 may include a thin film transistor (TFT) substrate 110 formed with a plurality of pixel driver integrated circuits (ICs) 137, a plurality of pixels 130 arranged on one surface (hereinafter referred to as 'front surface of the TFT substrate') of the TFT substrate, a panel driver 150 generating a control signal and providing the generated control signal to each pixel driver IC 137 formed on the TFT substrate, and a side wiring 170 formed on an edge of the TFT substrate 110 that electrically couples the pixel driver IC 137 with the panel driver 150. In some embodiments, the panel driver 150 may include a data driver 151 and a gate driver 153.

The TFT substrate 110 may form a plurality of data signal lines disposed horizontally a plurality of gate signal lines disposed vertically to control the plurality of pixels 130 arranged on the front surface 111 of the TFT substrate.

The front surface 111 of the TFT substrate is divided into an active area (AA), which is an area for displaying video images through a plurality of pixels 130, and a dummy area (DA) excluding the active area. The dummy area (DA) may correspond to the edge of the TFT substrate 110, and the dummy (DA) and the edge of the TFT substrate 110 are considered identical configurations in the present disclosure.

The plurality of pixels 130 may be arranged in matrix form on the front surface of the TFT substrate 110. Each pixel 130 may include three sub-pixels, e.g., an R sub-pixel 131, a G sub-pixel 132, and a B sub-pixel 133 corresponding to red, green, and blue colors. Each sub-pixel 131, 132 and 133 may be comprised of a light emitting diode emitting the color of the respective sub-pixel. The 'sub-pixel' and 'light emitting diode' are considered identical configurations and are used interchangeably in the present disclosure.

Referring to FIG. 2, the R, G, B sub pixels 131, 132 and 133 may be arranged in matrix form as shown in the top of the expanded area in the left of FIG. 2, or sequentially within one pixel 130 as shown in the bottom of the expanded area in the left of FIG. 2. However, the arrangement forms of the sub-pixels shown in FIG. 2 are merely examples and the R, G, B sub-pixels 131, 132 and 133 may be disposed in various forms within a signal pixel 130. In some embodiments, each single pixel 130 may include a corresponding pixel driver IC 137 (not shown in FIG. 2), and the pixel driver IC 137 may drive the light emitting diodes corresponding to each of the R, G, B sub-pixels 131, 132 and 133.

In other embodiments, one pixel 130 in the present disclosure may be defined as including three pixel driver ICs 137 for respectively driving R, G, B sub-pixels 131, 132 and 133. That is, in some embodiments, the pixel driver ICs 137 may correspond one to one with the R, G, B, sub-pixels 131, 132, and 133.

The panel driver 150 may be coupled to the TFT substrate 110 through a chip on glass (COG) bonding or film of glass (FOG) bonding method. The panel driver 150 such as the above drives a plurality of pixel driver ICs 137 to control the emission of a plurality of light emitting diodes 131,132 and 133 electrically coupled with each of the plurality of pixel driver ICs 137. In particular, the panel driver 150 may control the plurality of pixel driver ICs 137 per line through a data driver 151 and a gate driver 153.

The data driver 151 generates a control signal to sequentially control the plurality of horizontal lines formed on the front surface 111 of the TFT substrate line by line per video image frame, and may transfer the generated control signal to the pixel driver IC 137 coupled to each corresponding line. The gate driver 153 generates a control signal to sequentially control the plurality of vertical lines formed on the front surface 111 of the TFT substrate line by line per video image frame, and may transfer the generated control signal to the pixel driver IC 137 coupled to each corresponding line.

The side wiring 170 may be formed in plurality at predetermined intervals along the edge of the TFT substrate 110. As shown in FIG. 3, the side wiring 170 may electrically couple a first connection pad 121 formed on the front surface 111 of the TFT substrate and a second connection pad 123 formed on the back surface 113 of the TFT substrate. The side wiring 170 may physically connect the first connection pad 121 to the second connection pad 123. The first connection pad 121 may be formed in plurality at predetermined intervals along the top side of the front surface 111 of the TFT substrate and the left side of the front surface 111 of the TFT substrate, as shown in FIG. 3. The plurality of first connection pads 121 arranged along the top side of the front surface 111 of the TFT substrate 110 may be electrically coupled with the gate signal wiring, and the plurality of first connection pads 121 arranged along the left side of the front surface 111 of the TFT substrate may be electrically coupled with the data signal wiring. The first connection pads 121 arranged along the top side of the front surface 111 of the TFT substrate 110 may be physically connected to the gate signal wiring, and the first connection pads 121 arranged along the left side of the front surface 111 of the TFT substrate may be physically connected with the data signal wiring The side wiring 170 is formed on the edge of the TFT substrate 110, and to electrically couple the first connection pad 121 formed on the front surface 111 of the TFT substrate with the second connection pad 123 formed on the back surface 113 of the TFT substrate to each other, one end of the side wiring 170 may be electrically coupled to the first connection pad 121 and the other end of the side wiring 170 may be electrically coupled to the second connection pad 123.

Specifically, referring to FIG. 3, the side wiring 170 may include a first portion 171 formed on the front surface 111 of the TFT substrate 110, a second portion 172 formed on the side end surface 112 of the TFT substrate 110, and a third part 173 formed on the back surface 113 of the TFT substrate 110. The side wiring 170 may have a thickness t. In this configuration, the side wiring 170 may protrude from the side end surface 112 of the TFT substrate 110 by the thickness t of the side wiring 170 due to the second portion 172 being formed on the side end surface 112 of the TFT substrate 110.

Figure 4:
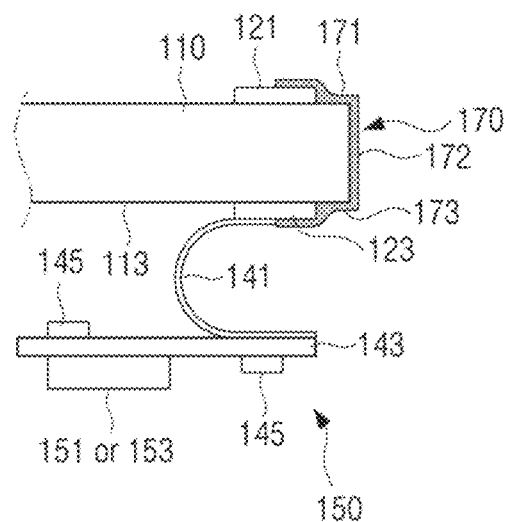
FIG. 4 is a cross-sectional diagram provided to show an example of a separate printed circuit board electrically coupled to a second connection pad electrically connected to side wiring of a back surface of a thin film transistor (TFT) substrate through a flexible printed circuit (FPC), according to an embodiment.

FIG. 4 is a cross-sectional diagram provided to show an example of a separate printed circuit board electrically coupled to a second connection pad electrically connected to side wiring of a back surface of a TFT substrate through a flexible printed circuit (FPC), according to an embodiment.

In some embodiments, the third part 173 formed on the back surface 113 of the TFT substrate may be electrically coupled with a panel driver 150 through a flexible printed circuit (FPC) 141. That is, the panel driver 150 may be electrically coupled to and physically connected to the second connection pad 123 by the FPC 141, as shown in FIG. 4. The panel driver 150 may include at least one electronic element 145 and a data driver 151 (or gate driver 153) mounted with an IC chip on a separate printed circuit board 143. The panel driver 150 may be disposed on the back surface 113 of the TFT substrate for a bezelless implementation of the display module 100. It should be noted that FIG. 4 shows the data driver 151 of the panel driver 150 connected to the second connection pad 123 by the FPC 141. However, the gate driver 153 of the panel driver 150 may be connected to another one of the second connection pads 123 by flexible printed circuit (FPC). In other words, the data driver 151 of the panel driver 150 and the gate driver 153 of the panel driver 150 may be connected to different ones of the second connection pads 123 by FPCs 141.

Figure 5:
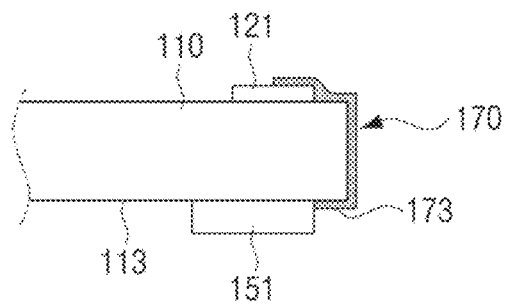
FIG. 5 is a cross-sectional diagram provided to show an example of a driver IC directly coupled with a side wiring of a back surface of a TFT substrate, according to an embodiment.

FIG. 5 is a cross-sectional diagram provided to show an example of a driver IC directly coupled with a side wiring of a back surface of a TFT substrate, according to an embodiment.

In some embodiments, the data driver 151 (or the gate driver 153) of the panel driver 150 may be directly mounted to the third part 173 formed on the back surface 113 of the TFT substrate as shown in FIG. 5. In this configuration, the second connection pad 123 and a separate printed circuit board 143 may be omitted. In this configuration, the electric element 145 mounted on the separate printed circuit board 143 may be mounted to the back surface 113 of the TFT substrate.

Hereinafter, an arrangement in which the display module configured as above is arranged in tiled type to form a large format display apparatus will be described to remove seams between the display modules.

Figure 6:
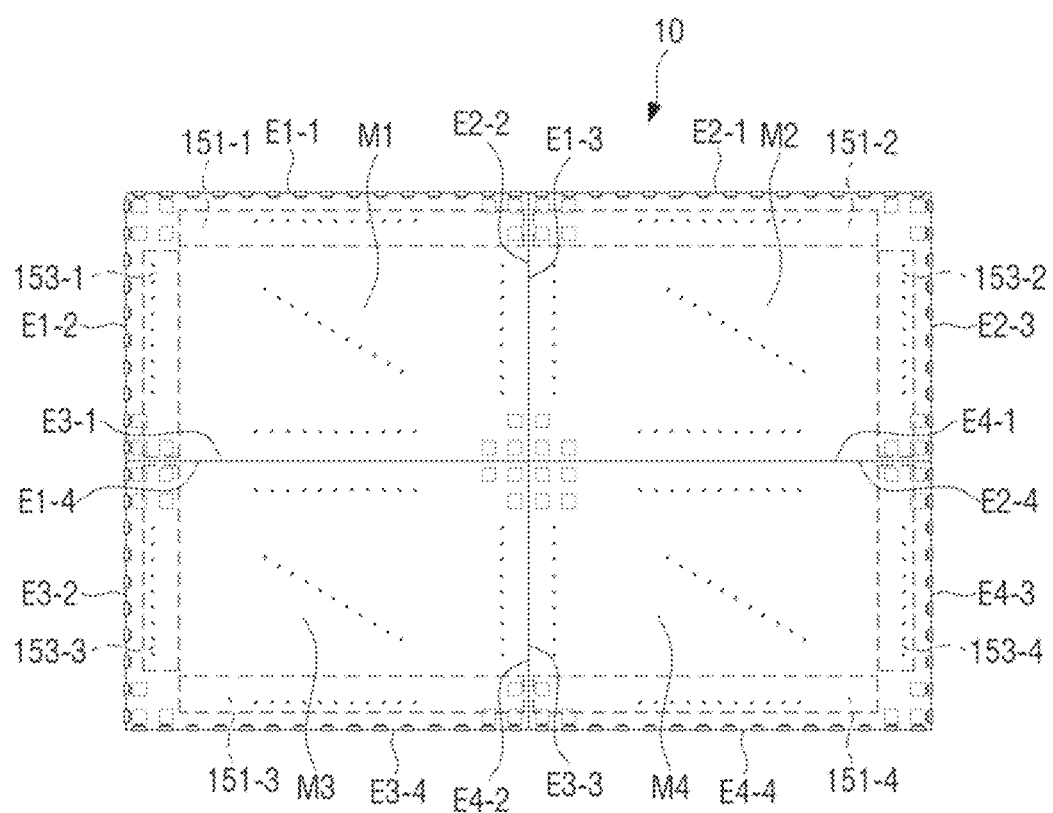
FIG. 6 is a front diagram provided to show a large format display apparatus in which display modules are arranged in plurality according to an embodiment.

FIG. 6 is a front diagram provided to show a large format display apparatus in which display modules are arranged in plurality according to an embodiment. In FIG. 6, each display module may be denoted with by Mn, where n is a positive integer).

Referring to FIG. 6, the large format display apparatus 10 according to an embodiment may comprise a first display module M1, a second display module M2, a third display module M3, and a fourth display module M4. Each display module M1 to M4 may include a panel driver 150 including data drivers 151-1 to 151-4 and gate drivers 153-1 to 153-4. In other words, the display module M1 may include a panel driver 150 including a data driver 151-1 and a gate driver 153-1, and the display module M2 may include a panel driver 150 including a data driver 151-2 and a gate driver 153-2, etc. In this configuration, each panel driver 150 may be disposed on the back surface of each display module through side wiring 170 formed along outside edges (with respect to the large format display apparatus 10) as shown in FIG. 6. The edge of each display module may be denoted by Em-n, where m and n are each positive integers. That is, display module M1 may have edges E1-1, E1-2, E1-3, and E1-4, and display module M2 may have edges E2-1, E2-2, E2-3, and E2-4, etc., as shown in FIG. 6.

The first display module M1 may be disposed on the left side of the top part of the large format display apparatus 10, the second display module M2 may be disposed on the right side of the top part of the large format display apparatus 10, the third display module M3 may be disposed on the left side of the bottom part of the large format display apparatus 10, and the fourth display module M4 may be disposed on the right side of the bottom part of the large format display apparatus 10, as shown in FIG. 6.

The first display module to the fourth display module M1 to M4 arranged as above may be disposed such that side wiring is not formed on edges that are in contact with each other. That is, side wiring 170 is not formed on interior edges of the first to fourth display modules M1 to M4 (with respect to the large format display apparatus 10).

That is, the edge E1-1 of the top part of the first display module M1 is formed with a plurality of side wirings 170 which electrically couple with a first data driver 151-1, and the edge E1-2 of the left side of the first display module M1 may be formed with a plurality of side wirings 170 that electrically couple with a first gate driver 153-1. The edge E2-1 of the top side of the second display module M2 may be formed with a plurality of side wirings 170 which electrically couple with a second data driver 151-2, and the edge E1-3 of the right side of the second display module M2 may be formed with a plurality of side wirings 170 which electrically couple with a second gate driver 153-2. The edge E3-4 of the bottom side of the third display module M3 may be formed with a plurality of side wirings 170 which electrically couple with a third data driver 151-3, and the edge E3-2 of the left side of the third display module M3 may be formed with a plurality of side wirings 170 which electrically couple with a third gate driver 153-3. The edge E4-4 of the bottom side of the fourth display module M4 may be formed with a plurality of side wirings 170 which electrically couple with a fourth data driver 151-4, and the edge E4-3 of the right side of the fourth display module M4 may be formed with a plurality of side wirings 170 which electrically couple with a fourth gate driver 153-4.

In this configuration, the edge E1-3 of the right side and the edge E1-4 of the bottom side of the first display module M1, the edge E2-2 of the left side and the edge E2-2 of the bottom side of the second display module M2, the edge E3-1 of the top side and the edge E3-3 of the right side of the third display module M3, and the edge E4-1 of the top side and the edge E4-2 of the left side of the fourth display module M4 are not formed with side wiring respectively.

Accordingly, each display module M1 to M4, with respect to the display modules adjacent to the display module, is arranged such that the edge not formed with side wiring is to be in contact with each other. The large format display apparatus 10 arranged with display modules configured as above may implement seamlessness that does not show a seam at the coupling portion between interior edges of each display module when outputting images or video to the screen.

Figure 7:
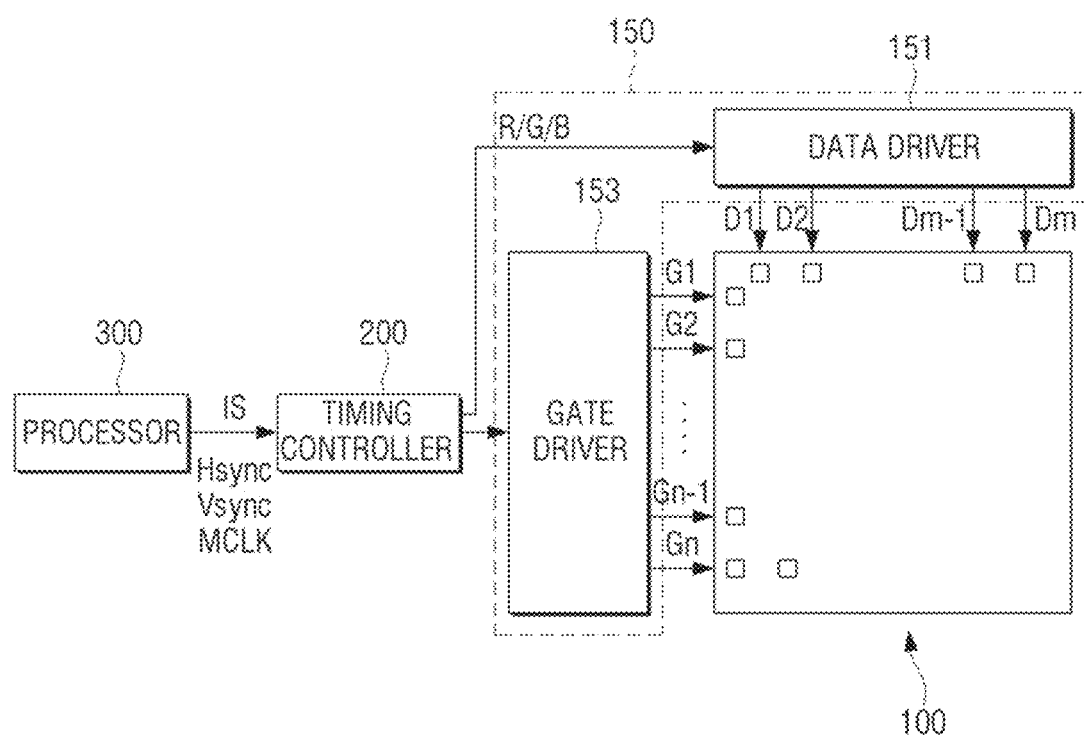
FIG. 7 is a block diagram provided to show both a timing controller and a processor to control a panel driver of a display module, according to an embodiment.

FIG. 7 is a block diagram provided to show both a timing controller and a processor to control a panel driver of a display module, according to an embodiment. Control of the display module included in the large format display apparatus will be described with reference to FIG. 7. For the sake of convenience in explanation, FIG. 7 only illustrates one display module from a plurality of display modules forming the large format display apparatus.

The timing controller 200, by controlling the panel driver 150, may drive each of the display modules 100.

The timing controller 200 may receive an input signal (IS), a horizontal synchronous (Hsync) signal, a vertical synchronous (Vsync) signal, a main clock signal (MCLK) signal, and the like from the processor 300, and may generate RGB image data signal, a scan control signal, a data control signal, an emission control signal, and the like to provide to the panel driver 150.

Further, the timing controller 200, in order to control the brightness of the RGB non-organic light emitting elements, may use at least one of a pulse width modulation (PWM) in which a duty ratio of a driving current (Id) may be varied and a pulse amplitude modulation (PAM) in which a pulse amplitude of a driving current (Id) may be varied.

For example, in the case of a pulse width modulation (PWM) signal, the longer the duty ratio (or drive time) of the driving current is, the higher the brightness of the light emitted by the non-organic light emitting elements, and the duty ratio (%) may be determined based on a dimming value input from the processor 300. On the other hand, in the case of a pulse amplitude modulation (PAM), the greater the pulse amplitude of the driving current is, the higher the brightness of the light emitted by the non-organic light emitting elements. Based on the above, various colors and gradations of video images may be displayed.

The panel driver 150 may include the data driver 151 and the gate driver 153.

The data driver 151 (or source driver), as a means to generate a data signal, may receive RGB image data from the timing controller 200 and generate various data signals. Further, the data driver 151 may sequentially transfer the generated various data signals through data lines D1 to Dm (m being a positive integer) coupled with the display module 100. In some embodiments, the data driver may be disposed on the back surface of the display module 100.

The gate driver 153, as means to generate various control signals such as a gate signal (or scan signal, GATE(n)), a reset signal (RES(n)), and a SENS(n), may sequentially transfer the generated various control signals through gate lines G1 to Gn (n being a positive integer) coupled with the display module 100. In some embodiments, the gate driver 153 may be disposed on the back surface of the display module 100.

Each display module 100 may include the TFT substrate 110 and a plurality of pixels 130 formed on the TFT substrate 110, as shown and described above with respect to FIGS. 2-5.

The pixel may be formed from RGB color sub-pixels, and the sub-pixels may be formed from light emitted from the non-organic light emitting elements by the data signal and control signal applied from the data driver 151 and the gate driver 153. To this end, the non-organic light emitting element may include a light emitting diode, a switching element (for example, a thin film transistor (TFT)) switching to an on/off state, and a storage capacitor.

Each display module 100 may dispose the data driver 151 to one side of an outer part area from the back surface of the display module 100, and may dispose the gate driver 153 to the other side of an outer part area adjacent to the one side of the outer part area in which the data driver 151 is disposed from the back surface of the display module 100, as illustrated and described with reference to FIG. 6.

Referring to FIG. 6, the large format display apparatus 10 according to an embodiment may be implemented as a large format display apparatus 10 such as a video wall by arranging a plurality of different display modules M1 to M4 in a 2×2 arrangement.

The first display module M1 and the fourth display module M4 may be disposed at [1,1] and [2,2] positions with a [0,0] position in the top left of the large format display apparatus 10, and the second display module M2 and the third display module M3 may be disposed at [1,2] and [2,1] positions, respectively. In this case, the data driver 151-1 and the gate driver 153-1 provided in the first display module M1 may be disposed opposite in the respective diagonal directions in terms of the data driver 151-4 and the gate driver 153-1 provided in the fourth display module M4. Likewise, the data driver 151-2 and the gate driver 153-2 provided in the second display module M2 may be disposed opposite in the respective diagonal directions in terms of the data driver 151-3 and the gate driver 153-3 provided in the third display module M3.

The large format display apparatus 10 of a 2×2 arrangement as above is only an example, and embodiments are not limited thereto. The arrangement form of the large format display apparatus and the number of display modules comprising the large format display apparatus may be variously modified, and will be described below.

The timing controller 200 may show various video images by driving the first display module to the fourth display module M1 to M4.

Specifically, the timing controller 200, based on receiving a video image signal from the outside, may generate a divided video image signal corresponding to the position of each of display module M1 to M4.

In addition, the timing controller 200, in terms of each of the first to fourth display modules M1 to M4, may transmit a video image signal corresponding to the position of the respective display modules.

For example, the timing controller 200 may divide the video image signal into 4 areas, and simultaneously transmit a RGB signal corresponding to a left side of a top end area of the video image to a left side of a top end of the first display module M1, a RGB signal corresponding to a left side of a bottom end area of the video image to a left side of a bottom end of the third display module M3, a RGB signal corresponding to a right side of a top end area of the video image to a right side of a top end of the second display module M2, and a RGB signal corresponding to a right side of a bottom end area of the video image to a right side of a bottom end of the fourth display module M4, respectively.

Meanwhile, in the above described example, the timing controller 200 is described as dividing the video image signal received from the processor 300 and transmit to each display module M1 to M4, but this is merely an example, and embodiments are not limited thereto. It should be noted that it is also possible to receive a divided video image signal from the outside and transmit to the corresponding display modules M1 to M4 respectively.

In the following, a large format display apparatus according to another embodiment comprising a different arrangement from the large format display apparatus having 4 display modules will be described.

Figure 8:
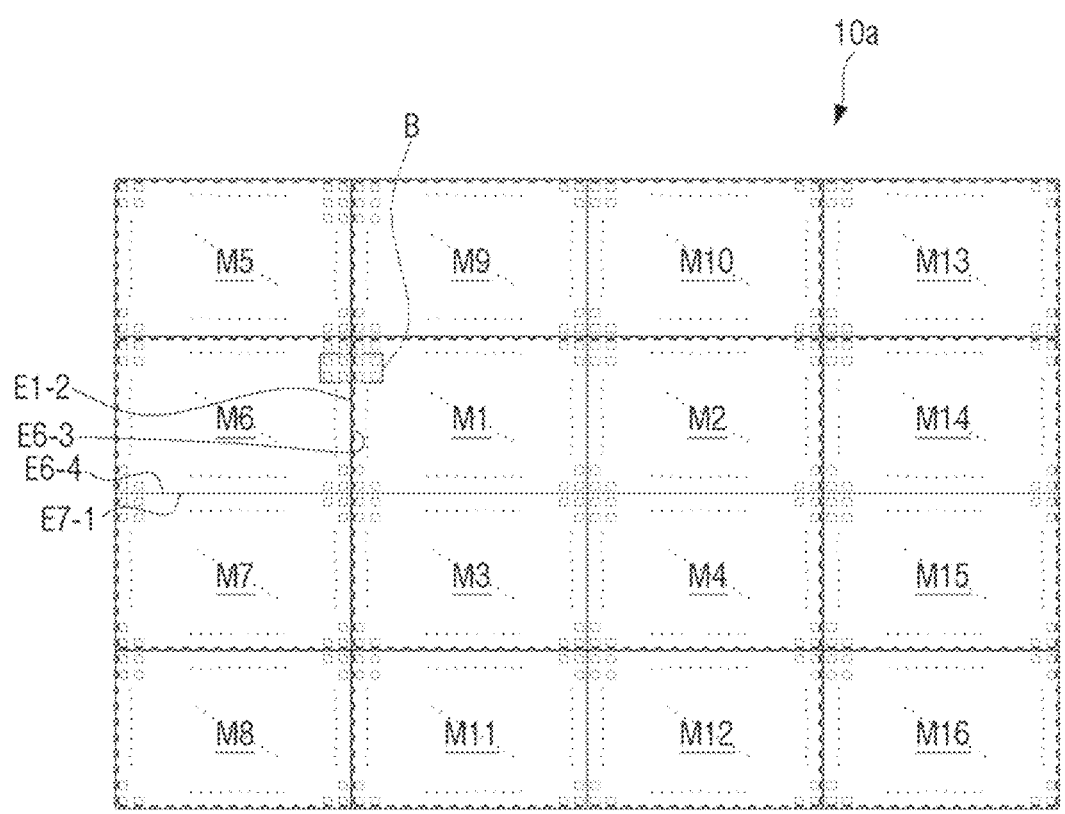
FIG. 8 is a front diagram provided to show an example of a large format display apparatus according to an embodiment.
Figure 9:
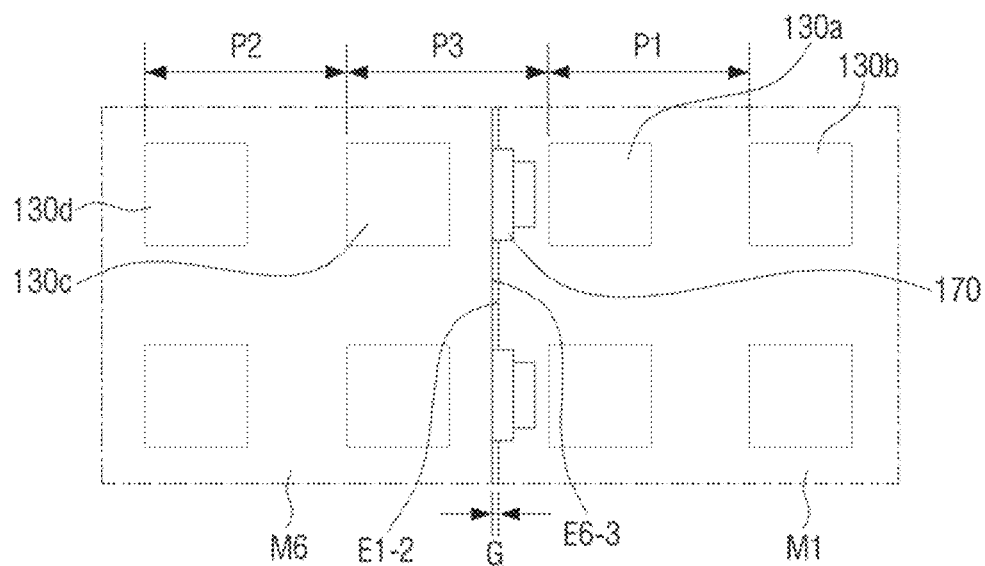
FIG. 9 is an enlarged diagram provided to show portion B indicated in FIG. 8, according to an embodiment.

FIG. 8 is a front diagram provided to show an example of a large format display apparatus according to an embodiment, and FIG. 9 is an enlarged diagram provided to show portion B indicated in FIG. 8, according to an embodiment.

Referring to FIG. 8, the large format display apparatus 10a may be formed by arranging 16 display modules.

The arrangement of each display module comprising the large format display apparatus 10a is as follows.

The first to the fourth display modules M1 to M4 may be arranged so that the edges without side wirings are in contact with each other as with the arrangement of the large format display apparatus 10 illustrated in FIG. 6.

The fifth to sixteenth display modules M5 to M16 may be arranged to surround the outer part of the first to fourth display modules M1 to M4 in a 2×2 arrangement.

Specifically, referring to FIG. 8, the fifth display module M5 is disposed on a left upper side in a diagonal direction of the first display module M1, the sixth display module M6 is disposed on the left side of the first display module M1, and the ninth display module M9 is disposed on the top side of the first display module M1.

In this case, the sixth display module M6 is configured such that the edge E6-3 without side wiring is in contact with the edge E1-2 of the first display module M1 with side wiring. Based on such an arrangement, a gap G may be formed between the first display module M1 and sixth display module M6 as shown in FIG. 9. The gap G may correspond to the thickness t (referring to FIG. 3) of the side wiring 170. Since the gap G between the first and sixth display modules M1 and M6 may be quite narrowly formed, the possibility of a seam showing would be low, but for a more complete seamlessness, intervals between pixels may be adjusted.

Specifically, a first pitch P1 between pixels 130a and 130b of the first display module M1 may be the same as a second pitch P2 between pixels 130c and 130d of the sixth display module M6. Accordingly, considering that the first pitch P1 and the second pitch P2 are the same, if the third pitch P3 between the pixel 130a formed on the edge E1-2 of the first display module M1 and the pixel 130c formed on the edge E6-3 of the sixth display module M6 is also maintained to be the same as the first pitch P1 and the second pitch P2, the seam between the first and sixth display modules M1 and M6 is no longer visible when operating a video image in a large format display apparatus 10a. In other words, in some embodiments, P1=P2=P3 such that the pixels 130 may have a same pitch over the large format display apparatus 10.

At this time, adjusting the third pitch P3 to be the same as that of the first pitch P1 and the second pitch P2 may be implemented through the following methods.

A first method is a method for adjusting the width (based on FIG. 9) of the sixth display module M6. That is, the edge E6-3 of the sixth display module M6 may be manufactured to cut vertically by a length corresponding to the gap G.

A second method is a method for adjusting the mounting position of the plurality of pixels mounted in the sixth display module M6. That is, the plurality of pixels of the sixth display module M6 may be moved by the length corresponding to the gap G toward the first display module M1 side to be all the same and mounted.

Accordingly, based on the edge without side wirings contacting the edge with side wirings among the display modules disposed adjacent to each other as illustrated in FIG. 8, by setting the pitch between pixels positioned closest between each of the display modules to all be the same as the pitch between pixels disposed on each display module, seamlessness may be implemented in a large format display apparatus 10a.

The sixth display module M6 and the seventh display module M7, by disposing the edges E6-4 and E7-1 without side wirings formed to be contact with each other, may implement seamlessness between each of the display modules M6 and M7. The ninth and tenth display modules M9 and M10, the eleventh and twelfth display modules M11 and M12, and the fourteenth and fifteenth display modules M14 and M15, like the above described sixth and seventh display modules M6 and M7, may also be disposed such that the edges without side wiring are in contact with each other.

The large format display apparatus 10a is disposed such that the display modules adjacent to each other are in contact with the edges without side wirings, and also by adjusting the pitch of pixels between each module based on the edges without side wirings being in contact with the edges with side wirings. Accordingly, the large format display apparatus 10a may prevent seams that may generate between each of the display modules.

Figure 10:
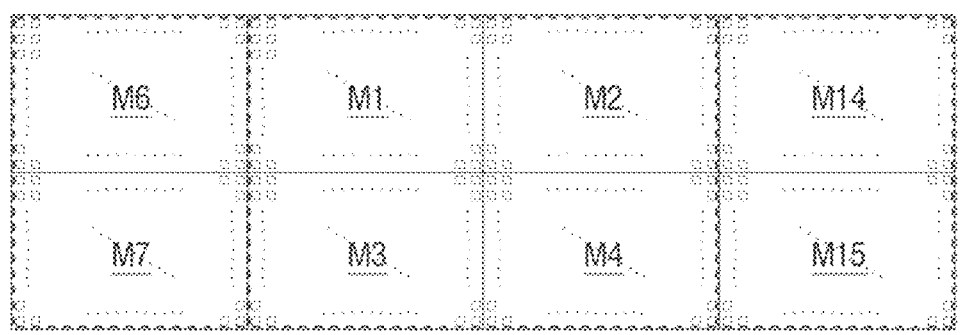
FIGS. 10 and 11 are front diagrams provided to show examples of large format display apparatuses according to various embodiments.
Figure 11:
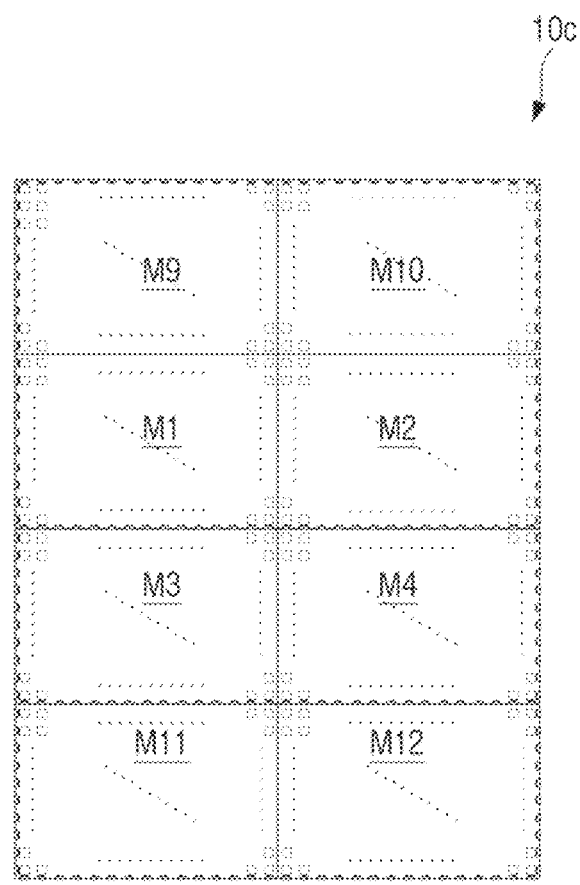

FIGS. 10 and 11 are front diagrams provided to show implemented examples of large format display apparatuses according to embodiments.

The large format display apparatus 10b shown in FIG. 10 is configured such that 2 display modules each (M6,M7; M14,M15) may be arranged toward the left side and right side of the first display module to the fourth display module M1 to M4 illustrated in FIG. 6 in a 2×2 arrangement.

In this configuration, the sixth display module M6 may be disposed such that the right side edge without side wirings is in contact with the left side edge of the first display module M1 with side wirings. Further, the sixth display module M6 may be disposed such that the bottom side edge without side wirings is in contact with the top side edge of the seventh display module M7 without side wirings.

The large format display apparatus 10b such as the above may be configured such that each display module is arranged to have a mix of a case where the edges of the display modules adjacent to each other are all without side wirings and a case where one of the two edges are with side wirings.

The large format display apparatus 10c shown in FIG. 11 is configured such that 2 display modules each (M9,M10; M11,M12) may be arranged toward the top side and bottom side of the first display module to the fourth display module M1 to M4 illustrated in FIG. 6 in a 2×2 arrangement.

The large format display apparatuses 10b and 10c such as the above may be configured such that each display module is arranged lengthwise in a horizontal direction or a vertical direction, and may implement seamlessness whichever the arrangement.

In addition, although not illustrated in the drawings, in some embodiments the large format display apparatus may be in various shapes that are not in a rectangular shape. For example, it is also possible to manufacture a large format display apparatus where at least one additional display module is in contact with at least one display module from the first to fourth display modules M1 to M4 illustrated in FIG. 6 in a 2×2 arrangement. In this case, the display module may be formed in various shapes such as an 1' shape, an inverted 1' shape, a 'T' shape, an inverted 'T' shape, or the like as well as may implement seamlessness between each display module.

The display module according to an embodiment of the disclosure may be applied to an electronic product or an electronic device that requires a wearable device, a portable device, a handheld device, or various displays, in a single unit. The display module may also be applied to a display device such as a monitor for a personal computer, a TV and a large format display device such as a digital signage, an electronic display through a plurality of assembly arrangements.

Each of the elements (for example, a module or a program) according to various embodiments may be composed of a single entity or a plurality of entities, and some sub-elements of the abovementioned sub-elements may be omitted, or other sub-elements may further be included in various embodiments. Alternatively or additionally, some elements (e.g., modules or programs) may be integrated into one entity to perform the same or similar functions performed by each respective element prior to integration. Operations performed by a module, program, or other element, in accordance with various embodiments, may be performed sequentially, in a parallel, repetitive, or heuristically manner, or at least some operations may be performed in a different order, omitted, or include a different operation.

The above description is merely illustrative of the technical idea of the disclosure, and it will be understood by those of ordinary skill in the art that various changes in form and details may be made therein without departing from the spirit and scope of the disclosure. In addition, the embodiments disclosed herein are not intended to limit the scope of the disclosure but to describe the technical spirit of the disclosure, and the scope of the technical spirit of the disclosure is not limited by the embodiments. Therefore, the scope of the disclosure is to be construed according to the following claims, and all the technical spirits within the equivalent scope is within the scope of the appended claims.

What is claimed is:

1. A large format display apparatus, wherein a plurality of display modules are consecutively connected, each of the plurality of display modules comprising:
    a substrate;
    a plurality of light emitting diodes arranged on one surface of the substrate;
    a plurality of first connection pads formed on the one surface of the substrate;
    a plurality of second connection pads formed on an opposite surface of the one surface; and
    a plurality of side wirings formed on each of a first edge of the substrate and a second edge of the substrate that is adjacent to the first edge, each of the plurality of side wirings electrically coupling a respective one of the plurality of first connection pads on the one surface of the substrate with a respective one of the plurality of second connection pads on the opposite surface,
    wherein each of the plurality of display modules is arranged such that edges having the side wirings are disposed on all outer edges of the large format display apparatus.

2. The large format display apparatus of claim 1, wherein every three light emitting diodes of the plurality of light emitting diodes comprise a pixel,
    wherein a plurality of the pixels are arranged on each of the plurality of display modules to form a lattice shape over the large format display apparatus, and
    wherein the pixels have a same pitch over the large format display apparatus.

3. The large format display apparatus of claim 1, wherein the plurality of display modules comprise a first display module to a fourth display module connected together in a 2×2 arrangement such that an edge without side wirings of one of the first display module to the fourth display module is in contact with another edge without side wirings of another one of the first display module to the fourth display module.

4. The large format display apparatus of claim 3, wherein every three light emitting diodes of the plurality of light emitting diodes comprise a pixel,
    wherein a plurality of the pixels are arranged on each of the first display module to the fourth display module in a lattice shape over the large format display apparatus, and
    wherein the pixels have a same pitch over the large format display apparatus.

5. The large format display apparatus of claim 3, wherein the first display module is arranged at a position [1,1], a second display module is arranged at a position [1,2], a third display module is arranged at a position [2,1], and the fourth display module is arranged at a position [2,2],
    wherein the first display module includes edges E1-1 and E1-2 that are each provided with the plurality of side wirings, and edges E1-3 and E1-4 that are not provided with the plurality of side wirings;
    wherein the second display module includes edges E2-1 and E2-3 that are each provided with the plurality of side wirings, and edges E2-2 and E2-4 that are not provided with the plurality of side wirings;
    wherein the third display module includes edges E3-2 and E3-4 that are each provided with the plurality of side wirings, and edges E3-1 and E3-3 that are not provided with the plurality of side wirings;
    wherein the fourth display module includes edges E4-3 and E4-4 that are each provided with the plurality of side wirings, and edges E4-1 and E4-2 that are not provided with the plurality of side wirings.

6. The large format display apparatus according to claim 5, wherein edges E1-3 and E2-2 are connected, edges E2-4 and E4-1 are connected, edges E3-3 and E4-2 are connected, and edges E1-4 and E3-1 are connected.

7. The large format display apparatus of claim 3, wherein every three light emitting diodes of the plurality of light emitting diodes comprise a pixel,
    wherein a plurality of the pixels are arranged at a first pitch in a lattice shape.

8. The large format display apparatus of claim 7, further comprising:
    at least one additional display module comprising a plurality of side wirings formed on each of two edges of the at least one additional display module that are adjacent to each other,
    wherein the at least one additional display module is arranged such that an edge thereof without side wirings is in contact with an edge of one of the plurality of display modules with side wirings, and
    wherein pixels on either side of abutting edges that are closest to each other are spaced apart at a second pitch that is the same as the first pitch.

9. The large format display apparatus of claim 1, wherein the plurality of display modules is configured such that:
    a first display module is formed with side wirings on each of a left side and a top side thereof,
    a second display module is formed with side wirings on each of a right side and a top side thereof,
    a third display module is formed with side wirings on each of a left side and a bottom side thereof, and
    a fourth display module is formed with side wirings on each of a right side and a bottom side thereof.

* * * * *